(12) United States Patent
Melchior et al.

(10) Patent No.: US 8,563,956 B1
(45) Date of Patent: Oct. 22, 2013

(54) INTRACAVITY LOSS ELEMENT FOR POWER AMPLIFIER

(71) Applicant: Cymer, Inc., San Diego, CA (US)

(72) Inventors: John Melchior, San Diego, CA (US); Robert J. Rafac, Encinitas, CA (US); Rostislav Rokitski, La Jolla, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

(21) Appl. No.: 13/650,261

(22) Filed: Oct. 12, 2012

Related U.S. Application Data

(63) Continuation-in-part of application No. 13/561,012, filed on Jul. 28, 2012.

(51) Int. Cl.
*H01S 3/00* (2006.01)
*G01N 21/33* (2006.01)

(52) U.S. Cl.
USPC ......... 250/504 R; 250/365; 250/372; 372/57; 372/61; 372/99; 372/108; 385/15

(58) Field of Classification Search
USPC ............ 250/504 R, 365, 372; 372/57, 61, 99, 372/108; 385/15
See application file for complete search history.

(56) References Cited

U.S. PATENT DOCUMENTS

| | | | |
|---|---|---|---|
| 7,885,309 B2 * | 2/2011 | Ershov et al. | 372/57 |
| 8,014,432 B2 * | 9/2011 | Ye et al. | 372/55 |
| 8,170,078 B2 * | 5/2012 | Ershov et al. | 372/57 |
| 8,488,922 B2 * | 7/2013 | Little et al. | 385/27 |

OTHER PUBLICATIONS

D.J.W. Brown et al., "XLR 500i: Recirculating Ring ArF Light Source for Immersion Lithography," Proc. of SPIE vol. 6520, 652020, 2007, 8 pages.

Vladimir Fleurov et al., "XLR 600i: Recirculating Ring ArF Light Source for Double Patterning Immersion Lithography," Proc. of SPIE vol. 6924, 69241 R, 2008, 5 pages.

* cited by examiner

*Primary Examiner* — Nikita Wells
(74) *Attorney, Agent, or Firm* — DiBerardino McGovern IP Group LLC

(57) ABSTRACT

An attenuation optical system is in a beam path of a light beam traveling through a regenerative ring resonator. The attenuation optical system includes an actuator configured to receive an electromagnetic signal; and a plate mounted to the actuator to be moveable between a plurality of positions, with each position placing an attenuation region in the beam path such that the beam profile is covered by the attenuation region and each attenuation region representing an attenuation factor applied to the light beam as determined by a geometry of the attenuation region. At least one attenuation region includes a plurality of evenly-spaced elongated openings between solid energy-reflecting surfaces and at least one attenuation region includes an open area that is larger than the beam profile of the light beam.

18 Claims, 15 Drawing Sheets

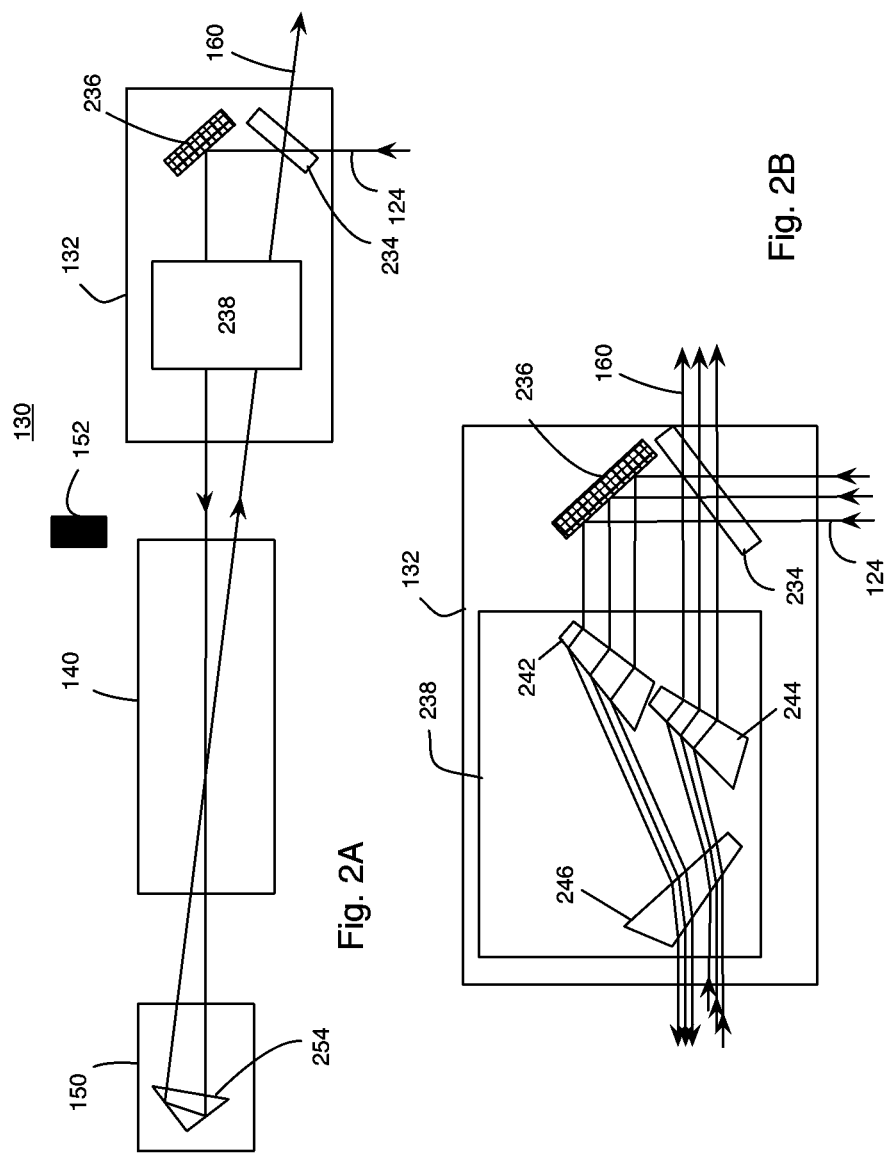

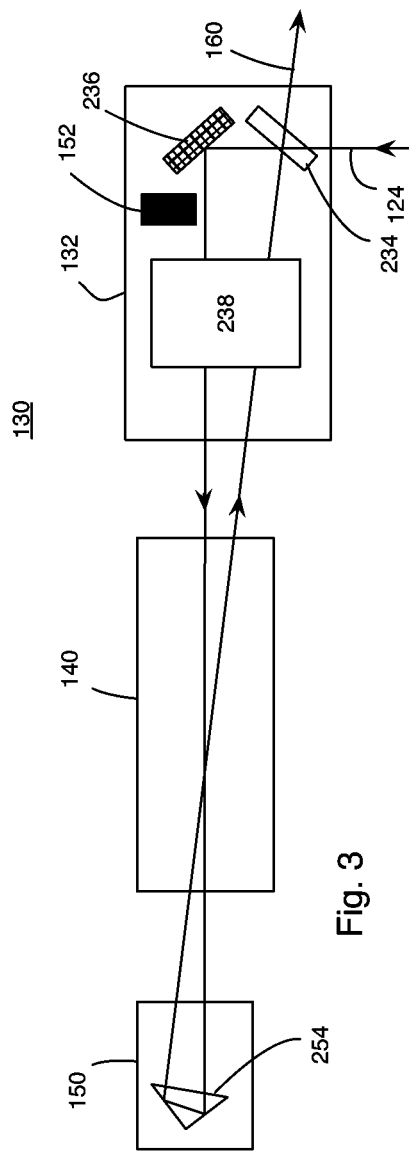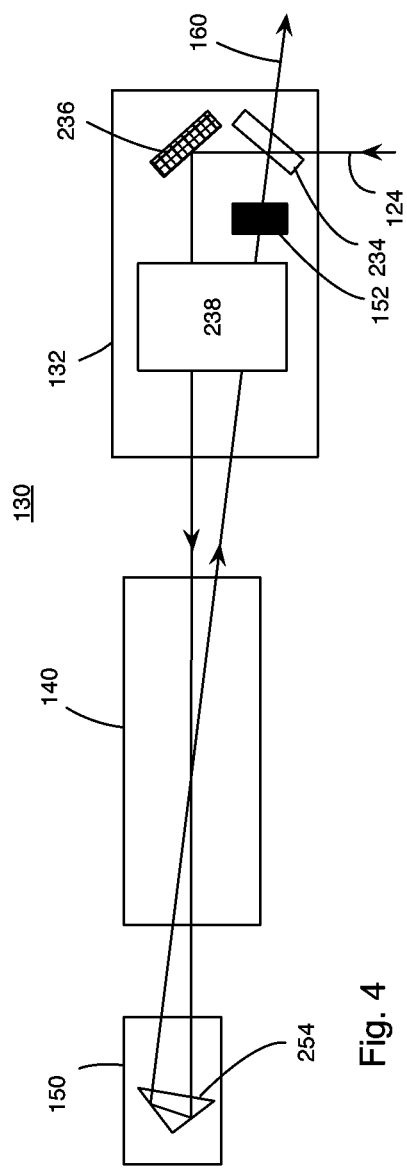

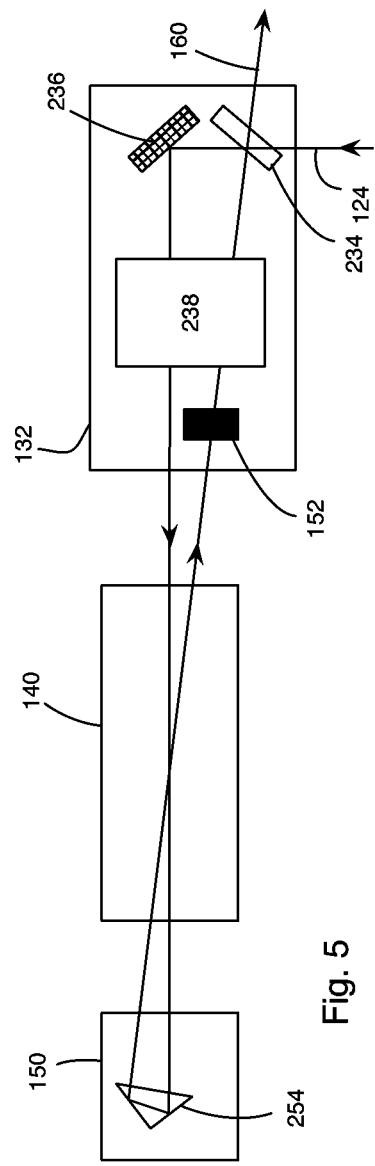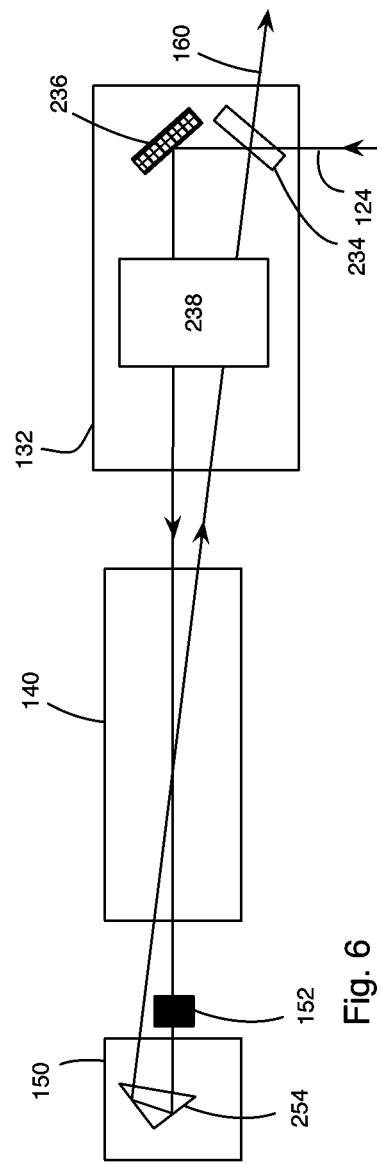

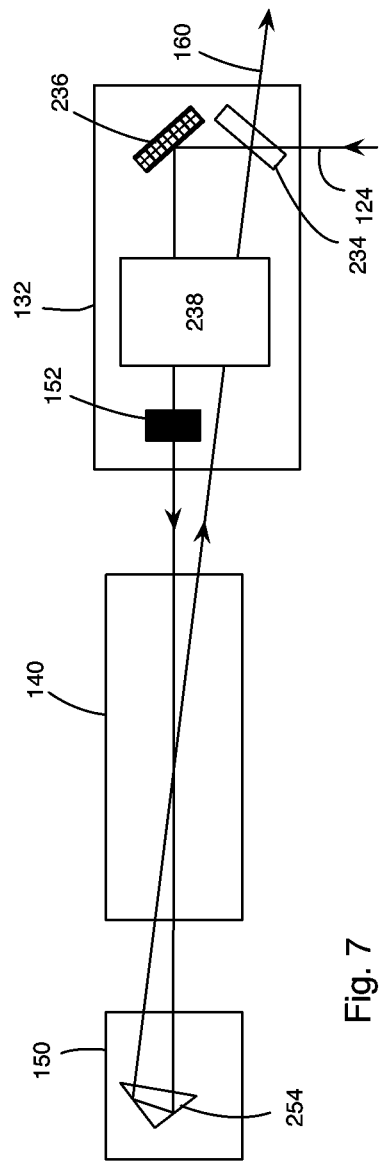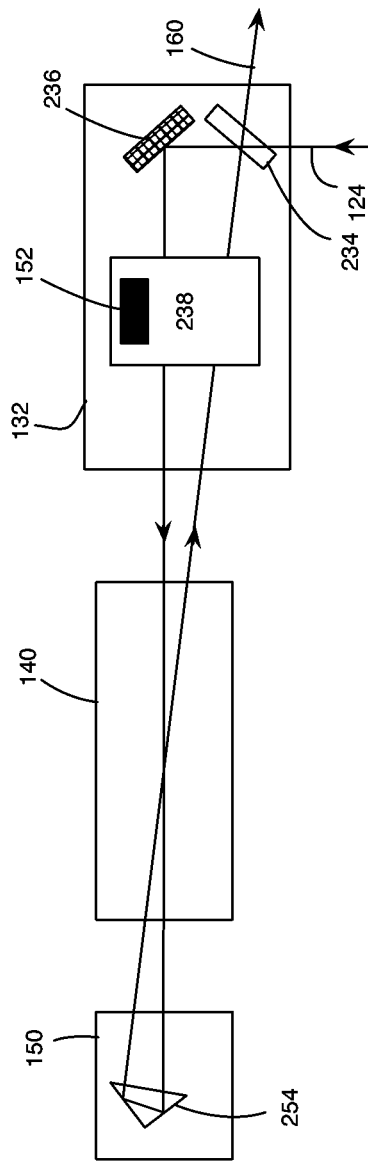
Fig. 7
Fig. 8

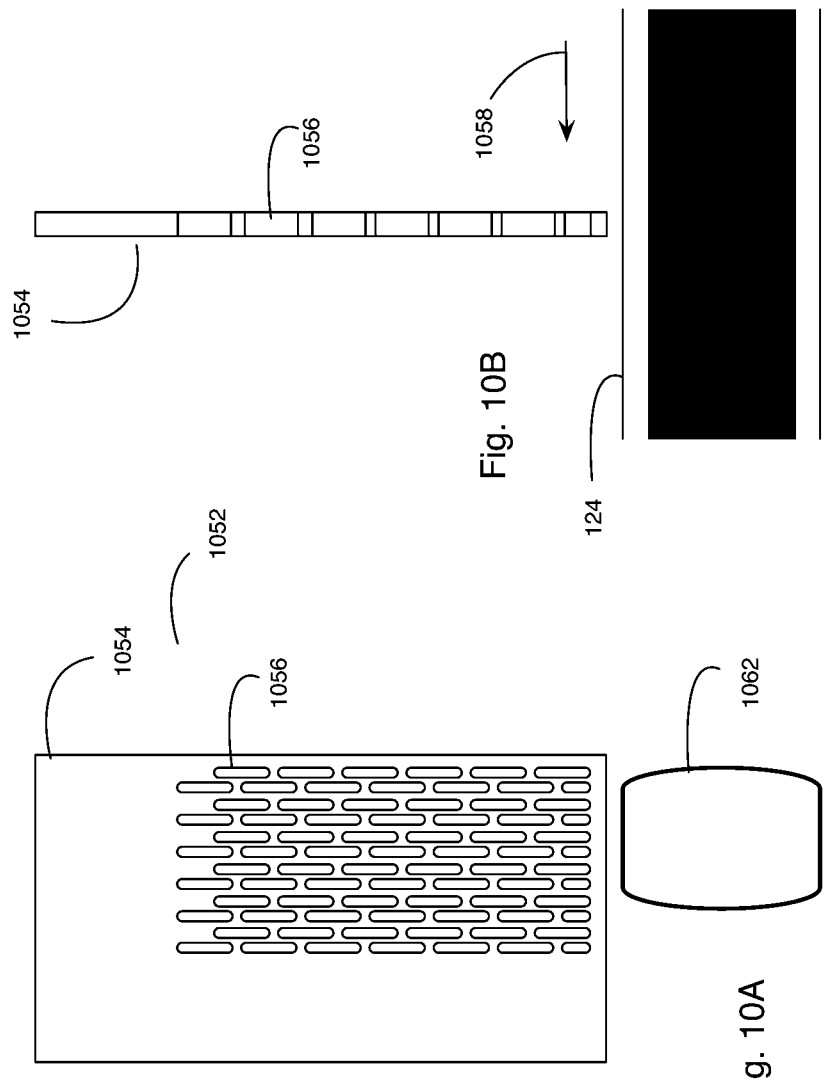

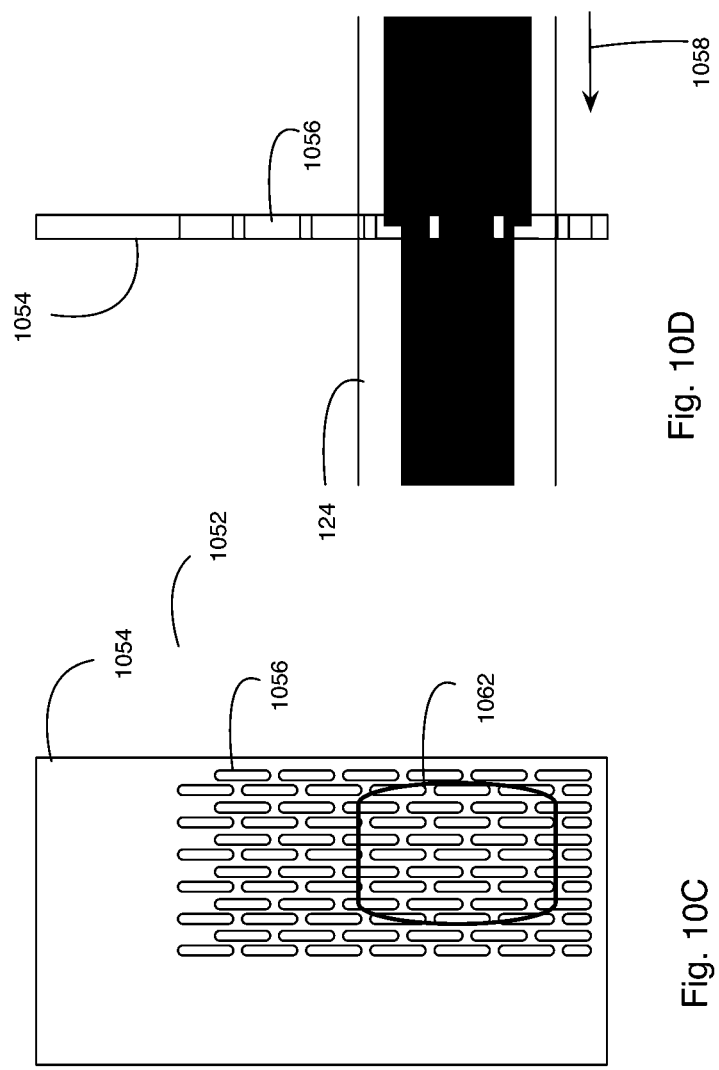

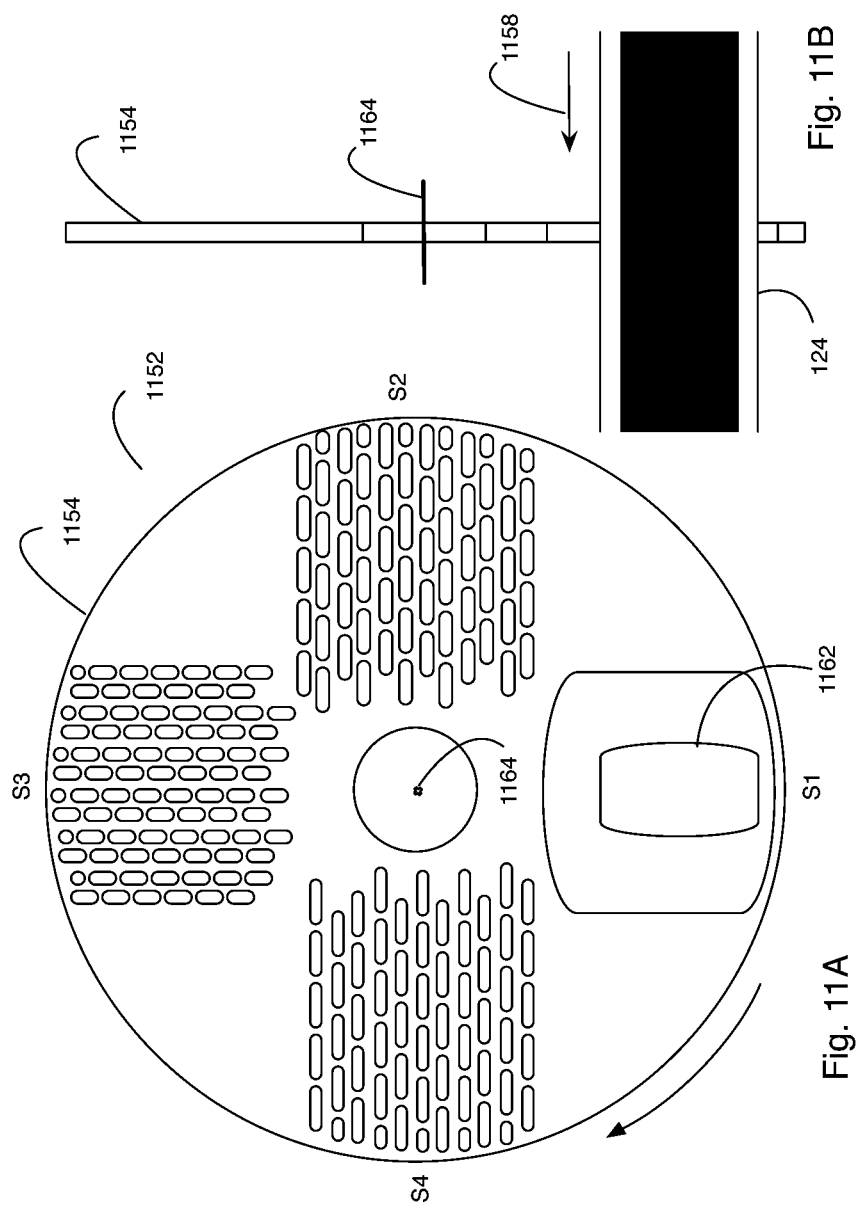

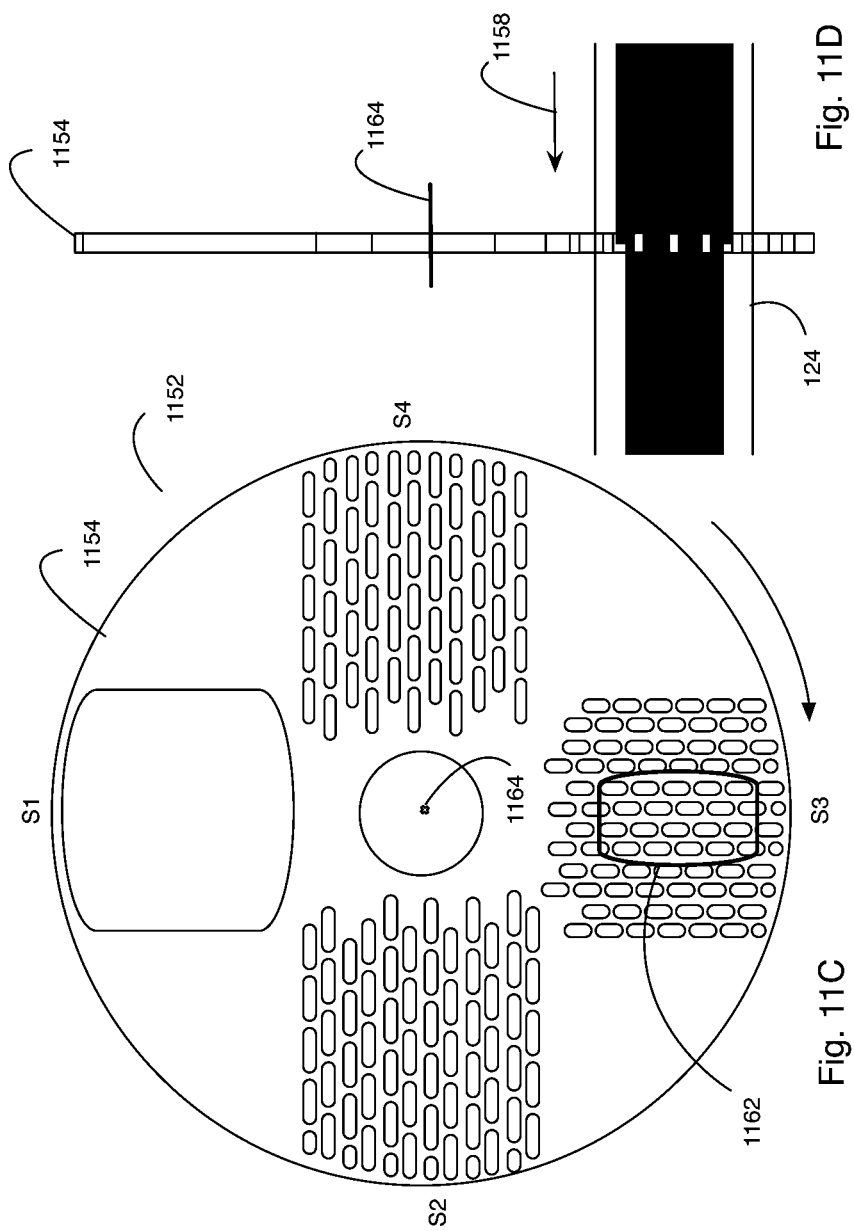

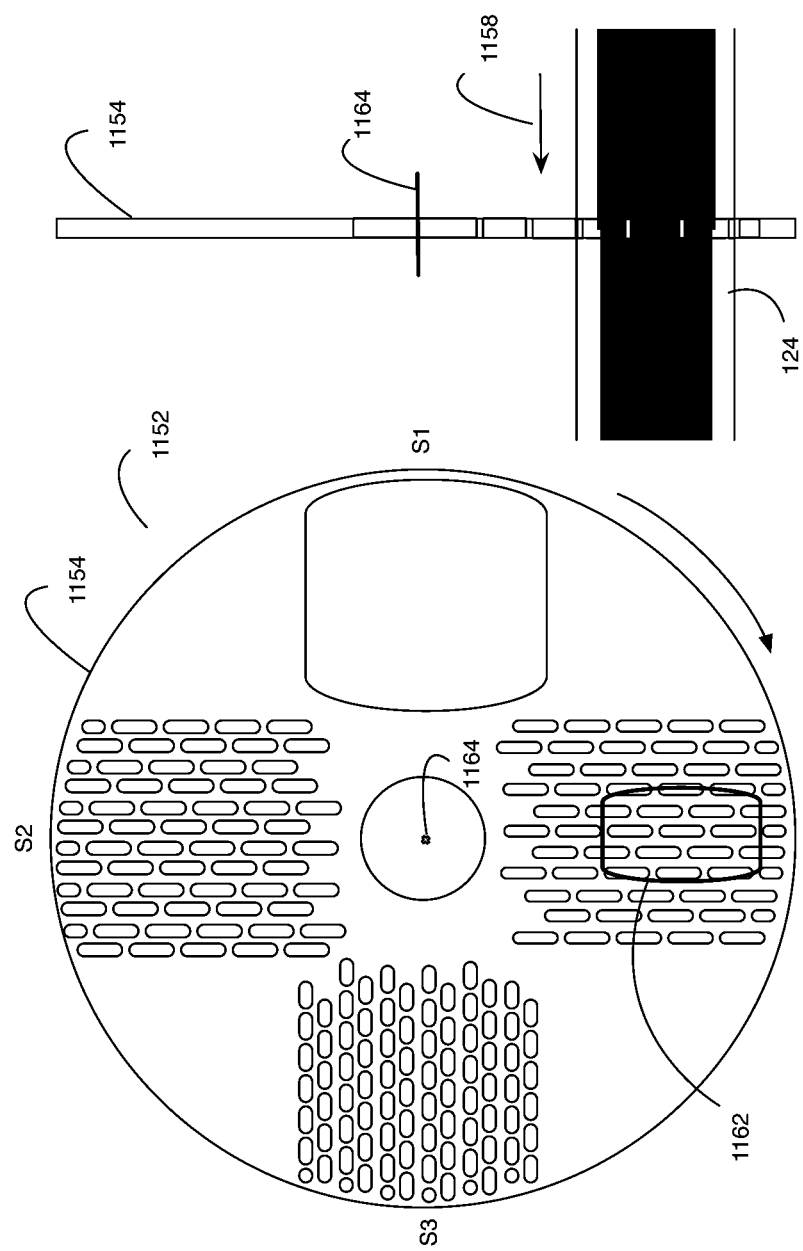

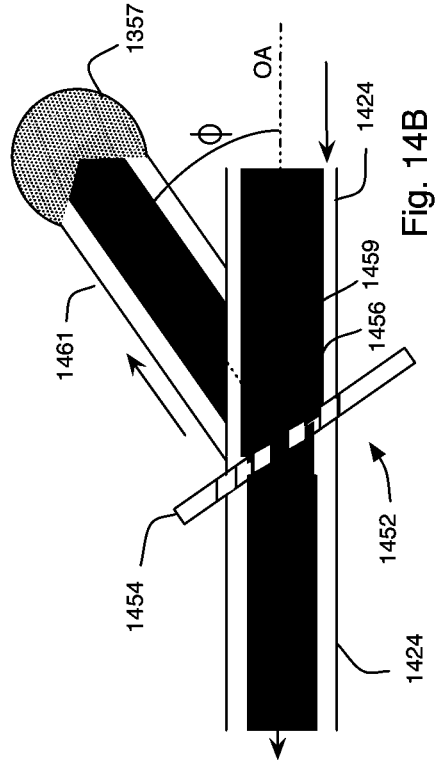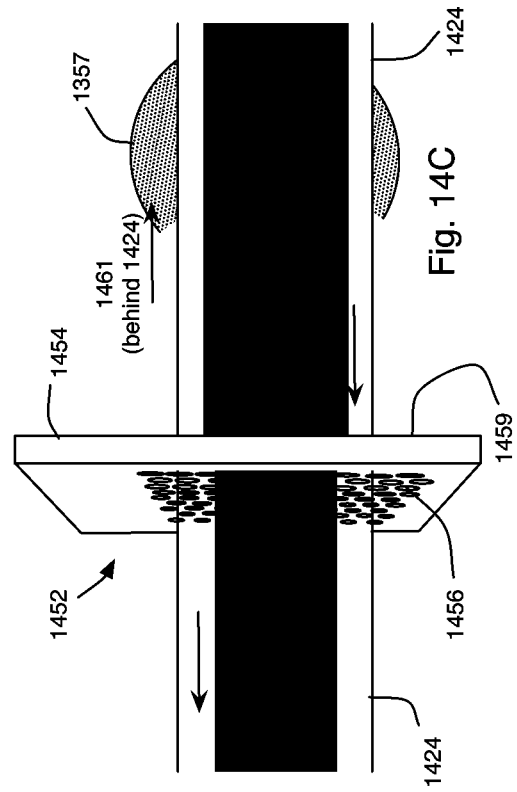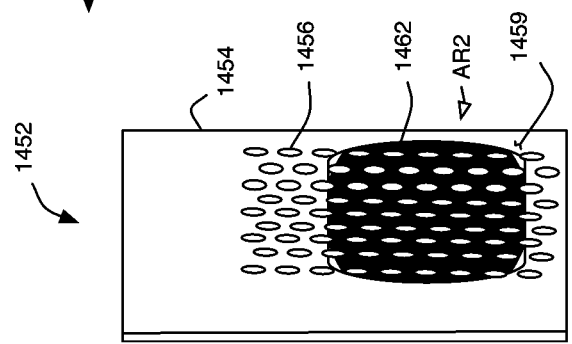
Fig. 14A
Fig. 14B
Fig. 14C

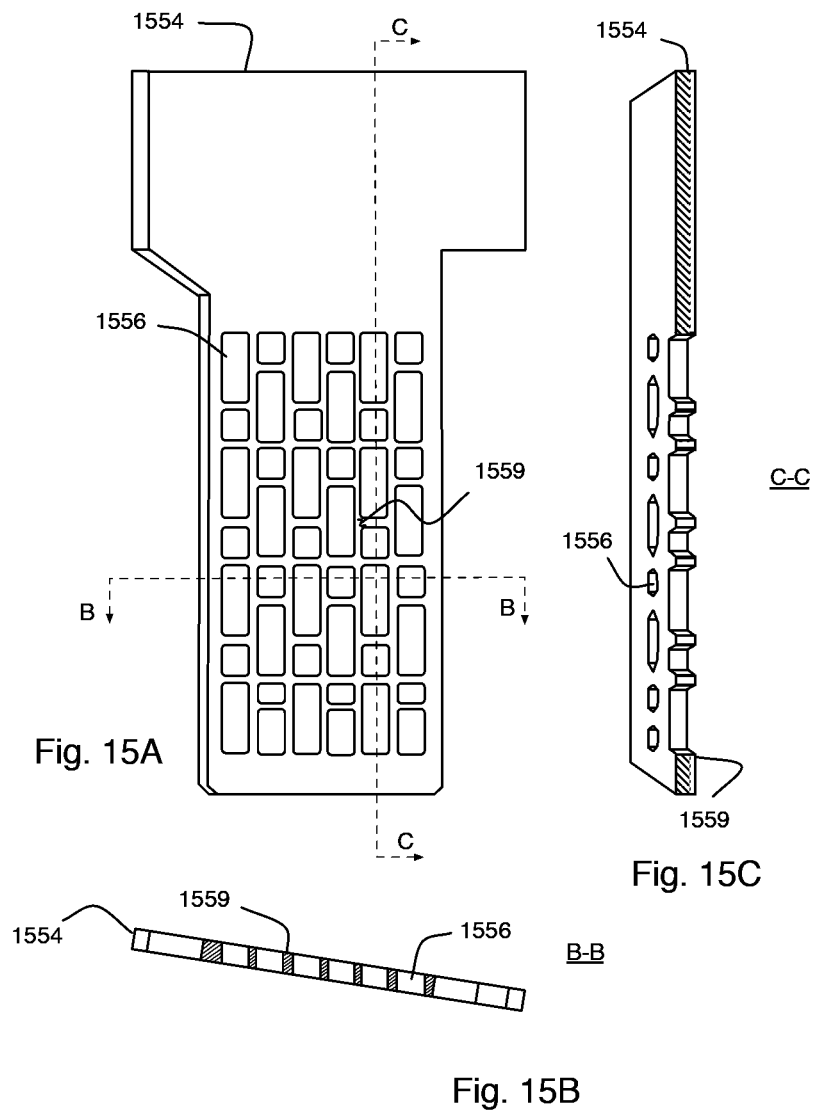

INTRACAVITY LOSS ELEMENT FOR POWER AMPLIFIER

CROSS REFERENCE TO RELATED APPLICATION

This application is a continuation-in-part of U.S. application Ser. No. 13/561,012, filed Jul. 28, 2012, the entire contents of which are incorporated herein by reference.

TECHNICAL FIELD

The disclosed subject matter relates to an intracavity loss element for a power amplifier of a high power deep ultraviolet two-stage light source.

BACKGROUND

Gas discharge lasers are used in photolithography to manufacture semiconductor integrated circuits. As semiconductor manufacturing has progressed to requiring smaller and smaller feature sizes (that is, the minimum feature size used to fabricate the integrated circuit), the design and performance of these lasers has improved. For example, gas discharge lasers have been redesigned to provide shorter wavelength and narrower bandwidth to support higher resolution, to provide higher powers to enable higher throughput, and to stabilize performance parameters such as dose, wavelength, and bandwidth.

Excimer lasers are one type of gas discharge laser used in photolithography that can operate in the ultraviolet (UV) spectral region at high average output power to generate nanosecond pulses at reduced spectral bandwidth.

In some cases, these lasers are designed with a dual chamber design having first and second chambers to separate the functions of providing narrow spectral bandwidth and generating high average output pulse energy. The first chamber is called a master oscillator (MO) that provides a seed laser beam and the second chamber is called a power amplifier (PA) or a power oscillator (PO). If the power amplifier is designed as a regenerative ring resonator then it is described as a power ring amplifier (PRA). The power amplifier receives the seed laser beam from the MO. The MO chamber enables fine tuning of parameters such as the center wavelength and the bandwidth at relatively low output pulse energies. The power amplifier receives the output from the master oscillator and amplifies this output to attain the necessary powers for output to use in photolithography. The dual chamber design can be referred to as a MOPA, MOPO, or MOPRA, depending on how the second chamber is used.

SUMMARY

In some general aspects, a deep ultraviolet light source includes a regenerative ring resonator and a control system. The regenerative ring resonator includes a discharge chamber having electrodes and a gain medium between the electrodes; an optical coupler that is partially reflective so that at least a portion of a light beam impinging on the optical coupler from the discharge chamber is reflected back through the discharge chamber and at least a portion of the light beam impinging on the optical coupler from the discharge chamber is transmitted through the optical coupler; and an attenuation optical system having a surface that is at least partly reflective to the light beam and is placed in the path of the light beam within the resonator. The attenuation optical system has a plurality of distinct attenuation states, with each attenuation state defining a distinct attenuation factor applied to the light beam. The control system is connected to the attenuation optical system and configured to select an attenuation state applied to the light beam to thereby adjust an energy of the light beam output from the light source.

Implementations can include one or more of the following features. For example, the regenerative ring resonator can be defined by the optical coupler and a beam reverser on a side of the discharge chamber opposite to the side at which the optical coupler is facing.

The regenerative ring resonator can include a beam magnification and de-magnification stage that de-magnifies the light beam as the light beam travels along a first direction from the optical coupler toward the discharge chamber and that magnifies the light beam as the light beam travels along a second direction away from the discharge chamber toward the optical coupler. The attenuation optical system can be inside the magnification and de-magnification stage. The magnification and de-magnification stage can include a set of prisms. The prism set can include first, second, and third prisms configured and arranged so that the first and third prisms reduce the transverse size of the profile of the light beam travelling along the first direction through the magnification and de-magnification stage, and the third and second prisms increase the transverse size of the profile of the light beam travelling along the second direction through the magnification and de-magnification stage.

The attenuation optical system can include a plate that defines the partly reflective surface, and has at least one mesh portion through which the light beam travels, the mesh portion applying the attenuation factor to the light beam. The mesh portion can include through openings defined within the partly reflective surface, the size and geometry of the openings and the reflectance of the partly reflective surface determine the attenuation factor of the light beam.

The attenuation factor applied to the light beam can include an amount of attenuation applied to the light beam. The attenuation amount applied to the light beam can be a loss in intensity of the flux of the light beam.

The attenuation optical system can include a plate on which the reflective surface is applied, the plate having openings through which the light beam travels, and the reflective surface configured to reflect a portion of the light beam off the path of the light beam within the resonator. The plate can be made of copper, and the reflective surface can be formed at least in part from an aluminum coating on the copper plate. The reflective surface can also include an overcoating of magnesium fluoride on top of the aluminum coating.

In other general aspects, a method is performed for switching between pulse energy ranges of a light beam output from a deep ultraviolet light source. The deep ultraviolet light source includes a master oscillator providing a seed light beam to a regenerative ring resonator of a power amplifier. The method includes selecting a pulse energy range for the output light beam from among a plurality of pulse energy ranges; based on the selected pulse energy range for the output light beam, applying a voltage to electrodes of a gas discharge chamber of the master oscillator, the applied voltage being selected from an available voltage control range for the master oscillator, and applying a voltage to electrodes of a gas discharge chamber of the regenerative ring resonator; operating the light source at the selected pulse energy range; and if it is determined that the pulse energy range of the output light beam is to be changed, selecting another pulse energy range for the output light beam by adjusting, within the regenerative ring resonator, an attenuation of the light beam while maintaining a ratio of a change of applied voltage to the master oscillator electrodes to the available voltage control range below a predetermined value. Adjusting the attenuation of the light beam within the regenerative ring resonator includes reflecting at least some of the flux of the light beam.

Implementations can include one or more of the following features. For example, the attenuation of the light beam can be adjusted by reflecting at least 50% of the flux of the light beam at the center wavelength of the light beam.

The ratio of the change of applied voltage to the master oscillator electrodes to the available voltage control range can be maintained below the predetermined value by maintaining the ratio below 0.10.

In other general aspects, a regenerative ring resonator is in the path of a light beam. The resonator includes a discharge chamber having electrodes and a gain medium between the electrodes; an optical coupler that is partially reflective so that at least a portion of a light beam impinging on the optical coupler from the discharge chamber is reflected back through the discharge chamber and at least a portion of the light beam impinging on the optical coupler from the discharge chamber is transmitted through the optical coupler; and an attenuation optical system in the path of the light beam within the resonator, the attenuation optical system having a plurality of distinct attenuation states, with each attenuation state defining a distinct attenuation factor applied to the light beam to provide adjustment of an energy of the light beam, the attenuation optical system comprising a reflective surface having through openings.

In other general aspects, an attenuation optical system is in a beam path of a light beam traveling through a regenerative ring resonator. The attenuation optical system includes an actuator configured to receive an electromagnetic signal; and a plate mounted to the actuator to be moveable between a plurality of positions, with each position placing an attenuation region in the beam path such that the beam profile is covered by the attenuation region and each attenuation region representing an attenuation factor applied to the light beam as determined by a geometry of the attenuation region. At least one attenuation region includes a plurality of evenly-spaced elongated openings between solid energy-reflecting surfaces and at least one attenuation region includes an open area that is larger than the beam profile of the light beam.

DRAWING DESCRIPTION

FIG. 2A is a block diagram of an exemplary power ring amplifier of the deep ultraviolet light source of FIG. 2A;

FIG. 2B is a block diagram of an exemplary beam modification optical system of the power ring amplifier of FIG. 2A;

FIGS. 3-8 are block diagrams of exemplary power ring amplifiers of the deep ultraviolet light source of FIG. 2A;

FIG. 10A is a view of an exemplary attenuation optical system taken along the optical axis of the light beam and showing the relative location of the transverse beam profile of the light beam when the attenuation optical system is in a first attenuation state;

FIG. 10B is a side view of the exemplary attenuation optical system of FIG. 10A;

FIG. 10C is a view of the attenuation optical system of FIG. 10A taken along the optical axis of the light beam and showing the relative location of the transverse beam profile of the light beam when the attenuation optical system is in a second attenuation state;

FIG. 10D is a side view of the attenuation optical system of FIG. 10C;

FIG. 11A is a view of an exemplary attenuation optical system taken along the optical axis of the light beam and showing the relative location of the transverse beam profile of the light beam when the attenuation optical system is in a first attenuation state;

FIG. 11B is a side view of the attenuation optical system of FIG. 11A;

FIG. 11C is a view of the attenuation optical system of FIG. 11A taken along the optical axis of the light beam and showing the relative location of the transverse beam profile of the light beam when the attenuation optical system is in a third attenuation state;

FIG. 11D is a side view of the attenuation optical system of FIG. 11C;

FIG. 11E is a view of the exemplary attenuation optical system of FIG. 11A taken along the optical axis of the light beam and showing the relative location of the transverse beam profile of the light beam when the attenuation optical system is in a fourth attenuation state;

FIG. 11F is a side view of the attenuation optical system of FIG. 11E;

FIG. 14A is a view of an exemplary reflective attenuation optical system as viewed along the optical axis of the light beam and showing the relative location of the transverse beam profile of the light beam when the reflective attenuation optical system is in a second attenuation state;

FIG. 14B is a top view of the reflective attenuation optical system of FIG. 14A;

FIG. 14C is a side view of the reflective attenuation optical system of FIG. 14A;

FIG. 15A is a view taken along the optical axis of the light beam of an exemplary reflective plate that can be used in the reflective attenuation optical systems of FIGS. 13A-14C;

FIG. 15B is a bottom cross-sectional view of the exemplary reflective plate taken along line B-B in FIG. 15A; and FIG. 15C is a side cross-sectional view of the exemplary reflective plate taken along line C-C in FIG. 15A.

DESCRIPTION

Figure 1:
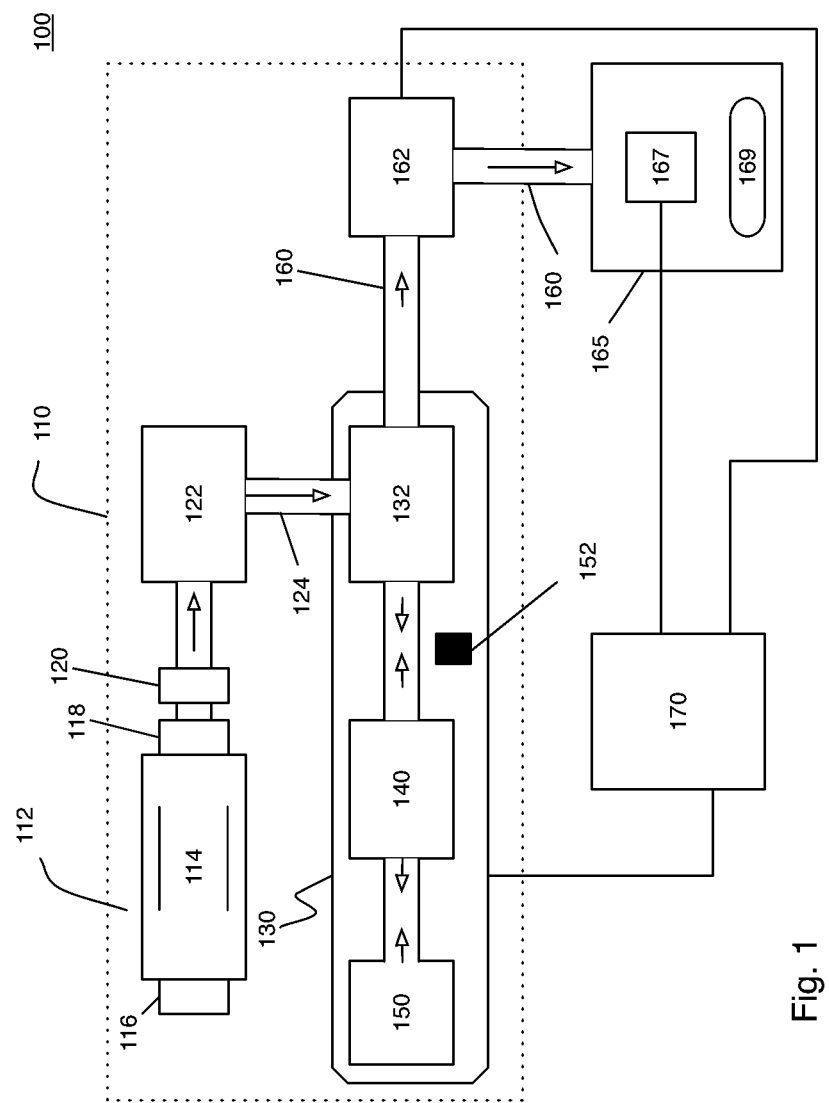
FIG. 1 is a block diagram of a photolithography system including a deep ultraviolet light source and an intracavity attenuation optical system.

Referring to FIG. 1, a photolithography system 100 includes a deep ultraviolet light source 110 such as an excimer light source that outputs a pulsed light beam 160 (which can be a laser beam) that is directed to a lithography exposure apparatus 165. As the light beam 160 enters the apparatus 165, it is directed through optics 167 that modify the beam such as a reticle (or mask) that filters the beam, and that modified beam is projected onto a prepared wafer 169. In this way, a chip design is patterned onto a photoresist that is then etched and cleaned, and the process repeats. The lithography exposure apparatus 165 can be an immersion system or a dry system, depending on the application.

The system 100 also includes a control system 170 that is connected to components of the light source 110 as well as the lithography exposure apparatus 165 to control various operations of the system 100.

The light source 110 can be designed as a dual chamber architecture that includes a master oscillator (MO) 112 that provides a seed light beam to a power amplifier (PA) 130, which can be configured as a regenerative ring resonator. The master oscillator 112 enables fine tuning of parameters such as the center wavelength and the bandwidth at relatively low output pulse energies. The power amplifier 130 receives the output from the master oscillator 112 and amplifies the output to attain the necessary powers in the light beam 160 for output to use in the lithography apparatus 165.

The master oscillator 112 includes a discharge chamber 114 having two elongated electrodes 115, a gain medium that is a gas mixture, and a fan for circulating gas between the electrodes 115. A resonator is formed between a line narrowing module 116 on one side of the discharge chamber 114 and an output coupler 118 on a second side of the discharge chamber 114. The line narrowing module 116 can include a diffractive optic such as a grating that finely tunes the spectral output of the discharge chamber 114. The master oscillator 112 also includes a line center analysis module 120 that receives an output from the output coupler 118 and a beam modification optical system 122 that modifies the size or shape of the light beam as needed to form the seed light beam 124. The gas mixture used in the discharge chamber 114 can be any suitable gas for producing a light beam at the required wavelength (ultraviolet) and bandwidth. For example, for an excimer source, the gas mixture typically contains a noble gas (rare gas) (for example, argon, krypton, or xenon) and a halogen (for example, fluorine or chlorine), apart from helium and/or neon as buffer gas. Specific examples of the gas mixture include argon fluoride (ArF), which emits light at a wavelength of about 193 nm, krypton fluoride (KrF), which emits light at a wavelength of about 248 nm, or xenon chloride (XeCl), which emits light at a wavelength of about 351 nm. The excimer gain medium (the gas mixture) is pumped with short (for example, nanosecond) current pulses in a high-voltage electric discharge by application of a voltage to the elongated electrodes 115.

The power amplifier 130 includes a beam modification optical system 132 that receives the seed light beam 124 from the master oscillator 112 and directs the light beam through a discharge chamber 140, and to a beam turning optical element 150 where the direction of the light beam is modified so that it is sent back into the discharge chamber 140. If the power amplifier 130 is designed as a regenerative ring resonator, then the light beam is directed through the power amplifier 130 to form a circulating path.

The discharge chamber 140 includes a pair of elongated electrodes 141, a gain medium that is a gas mixture, and a fan for circulating the gas mixture between the electrodes 141. In the regenerative ring resonator design, the seed light beam 124 is amplified by repeatedly passing through the discharge chamber 140. The optical system 132 provides a way (for example, an optical coupler such as a partially-reflecting mirror, discussed below) to in-couple the seed light beam 124 and to out-couple a portion of the amplified radiation from the ring resonator to form the output light beam 160. The output light beam 160 is directed through a bandwidth analysis module 162, where various parameters of the beam 160 can be measured. The output light beam 160 can also be directed through a pulse stretcher, where each of the pulses of the output light beam 160 is stretched, for example, in an optical delay unit, to adjust for performance properties of the light beam that impinges the lithography apparatus 165.

The power amplifier 130 also includes an attenuation optical system 152 in the path of the light beam within the resonator defined in the amplifier 130. As discussed in greater detail below, the attenuation optical system 152 has a plurality of distinct attenuation states, with each attenuation state defining a distinct attenuation factor applied to the light beam 160.

The system 152 is "in the path" of the light beam in that it is either directly in the path of the light beam so that the beam profile impinges upon matter of the system 152 or it is adjacent to the path of the light beam so that the beam profile freely passes through the system 152 or next to the system 152 without touching the matter of the system 152. Various components of the system 152 may be moved, for example, rotated about the optical axis of the light beam or about an axis that is perpendicular to the optical axis, or translated along a linear path that is perpendicular to the optical axis of the light beam, as discussed below, to adjust the attenuation factor applied to the light beam 160. Thus, the attenuation optical system 152 can also include one or more actuators for moving components of the system 152 to provide for the adjustment. The adjustment of the attenuation factor applied to the light beam 160 can be in a step-wise or discrete manner or it can be in a continuous manner.

The pulse energies output from the master oscillator 112 and the power amplifier 130 are determined by the respective gains applied and the losses (which cause a loss in intensity of the beam flux through the gain medium) within the respective chambers. The gain in the master oscillator and the gain in the power amplifier are determined by the respective operating voltages, that is, the voltage applied to the respective discharge electrodes. Thus, the pulse energy output from the power amplifier 130 can be adjusted by adjusting the losses within the power amplifier 130 without having to adjust the operating voltage of either the master oscillator 112 or the power amplifier 130. The attenuation optical system 152 is therefore provided within the power amplifier 130 to adjust the loss in the power amplifier 130 to thereby adjust the pulse energy of the light beam 160 output from the power amplifier 130 without requiring an adjustment to the operating voltages and without requiring other adjustments to the gain medium (for example, without requiring a gas refill with a different fill pressure to adjust the gain). Additionally, because the attenuation is applied to the light beam 124 in the power amplifier 130, the master oscillator 112 cavity loss is not modified, and because the operating voltage of the master oscillator 112 remains within an acceptable level, the master oscillator 112 output pulse energy does not change appreciably.

The control system 170 is connected to various components of the light source 110. For example, the control system 170 is coupled to the electrodes 115, 141 within the master oscillator 112 and the power amplifier 130, respectively, for controlling the respective pulse energies of the master oscillator 112 and the power amplifier 130, and also for controlling the pulse repetition rates, which can range between about 1000 and 12,000 Hz or greater. The control system 170 therefore provides repetitive triggering of the discharges in the chamber of the master oscillator 112 and the discharges in the chamber of the power amplifier 130 relative to each other with feedback and feed-forward control of the pulse and dose energy. The repetitively-pulsed light beam 160 can have an average output power of between a few watts and hundreds of watts, for example, from about 40 W to about 200 W. The irradiance (that is, the average power per unit area) of the light beam 160 at the output can be at least about 60 W/cm² or at least about 80 W/cm².

Typically, the output power of the light source 110 is calculated at 100% duty cycle (that is, the continuous firing of the electrodes in the master oscillator 112 and the power amplifier 130 of the light source 110) at a nominal pulse repetition rate and a nominal pulse energy. Thus, for example, at a nominal pulse repetition rate of 6000 Hz and a 15 mJ nominal pulse energy, the output power of the light source 110 (which is the power of the light beam 160) is 90 W. As another example, at a nominal pulse repetition rate of 6000 Hz and a 20 mJ nominal pulse energy, the output power of the light source 110 (which is the power of the light beam 160) is 120 W.

The control system 170 is connected to the actuators of the attenuation optical system 152 to move components of the attenuation optical system 152 to adjust the loss within the power amplifier 130 (by modifying the attenuation factor applied to the light beam), and to thereby adjust the average output power of the light beam 160.

As discussed above, the attenuation is applied to the light beam 160 while maintaining the operating voltage of the master oscillator 112 within an acceptable level. The operating voltage is the voltage applied to the master oscillator 112; and it is possible that the voltage applied to the electrodes 115 of the master oscillator 112 will change when the attenuation applied to the light beam 160 is adjusted. However, the ratio of the change in this applied voltage to an available voltage control range is kept below a predetermined acceptable value. For example, the operating voltage may change by as much as about 20 V when an adjustment is made to the attenuation factor; while the available voltage control range is about 200 V; in this example, the ratio is as high as 0.10.

Referring to FIGS. 2A and 2B, an exemplary power ring amplifier 130 is shown in which the attenuation optical system 152 is placed in a generic location within power ring amplifier 130. Specific exemplary placements for the attenuation optical system 152 are described and shown in FIGS. 3-8.

In these examples, the power ring amplifier 130 is designed as a regenerative ring resonator. In such a design, a standard tilted double-pass optical path through the discharge chamber 140 is closed with the use of an optical coupler 234 to form a recirculating resonant structure that enables regenerative amplification of the seed light beam pulse from the master oscillator 112. The seed light beam 124 from the master oscillator 112 is directed through the optical coupler 234, which is a partially reflecting mirror (and can be referred to as an input/output coupler) and serves as both the entrance into the ring resonator and also the exit from the ring resonator. The optical coupler 234 can have a reflectivity of between about 10% to about 60%; to form an oscillation cavity that allows the pulse intensity to build up during the oscillation through the excited gain medium in the discharge chamber 140 between the electrodes during the electrical discharge.

The light beam that travels through the optical coupler 234 is reflected from a reflecting optic such as a mirror 236 toward the discharge chamber 140. The mirror 236 can have a high reflectivity, for example greater than about 90% at or near the center wavelength of the light beam for the desired polarization at the angle of incidence used. The light beam reflected from the mirror is directed through the discharge chamber 140 and toward the beam turning optical element 150, which in this implementation is a prism 254. The light beam reflected from two surfaces of the prism 254 reenters the discharge chamber 140 along another path and back toward the optical coupler 234, where, as discussed above, some of the light beam is reflected back into the ring resonator while some of the light beam is transmitted through the optical coupler 234 as the output light beam 160.

The beam turning optical system 150 is an optical system made of one or more precision devices having precision optical materials such as materials having a crystalline structure such as calcium fluoride (CaF2) and also includes precision optically finished faces. Although a prism 254 is shown in these examples, the beam turning optical system 150 can be any combination of one or more optical devices that receive the light beam and change the direction of the light beam so that it is transmitted back into the discharge chamber 140. Thus, in other implementations, the beam turning optical system 150 can include a plurality of mirrors arranged to reflect the light beam back into the discharge chamber 140.

Additionally, the light beam that is reflected from the mirror 236 through the discharge chamber 140 is usually compressed before entering the discharge chamber 140 so that it can substantially match the transverse size of the gain medium in the discharge chamber 140. If the light beam is compressed before entering the discharge chamber 140, then it is also expanded as it exits the discharge chamber 140. In order to perform the compression and expansion, a beam magnification/de-magnification system 238 is positioned between the discharge chamber 140 and the mirror 236 and optical coupler 234. The beam magnification/de-magnification system 238 can include any number of optical elements such as prisms to perform the compression and expansion of the beam.

One particular implementation of the beam magnification/de-magnification system 238 is shown in FIG. 2B. This system 238 includes first prism 242, second prism 244, and third prism 246. The first prism 242 and the third prism 246 act together to compress the incoming light beam 124, and the third prism 246 also aligns the incoming light beam with both windows of the discharge chamber 140. The third prism 246 shifts the outgoing light beam 140 (which has been reflected by the prism 254 back through the discharge chamber 140) to the second prism 244, which shifts the light beam to the optical coupler 234. The third prism 246 and the second prism 244 act together to magnify or expand the outgoing light beam, the one that exits the discharge chamber 140 toward the optical coupler 234, to match the transverse size of the incoming light beam 124. The outgoing light beam impinges upon the optical coupler 234, where it is either transmitted through to form the light beam 160 or it is reflected back into the ring resonator.

All of the optical components (such as the optical coupler 234, the mirror 236, the prisms 242, 244, 246, 254, and the chamber windows) are typically crystalline structures that are able to transmit very high pulse energy light or laser pulses at very short wavelengths (deep ultraviolet wavelengths) with minimal losses. For example, the components can be made of calcium fluoride (CaF2), magnesium fluoride (MgF2), or fused silica.

The following discussion uses the terms "beam profile," "near field," and "far field" to describe some of the optical effects noticed within the power ring amplifier 130. The term "beam profile" is the distribution of energy in position across a direction that is transverse to the beam propagation direction. The "near field" beam profile refers to the distribution of electromagnetic energy in the vicinity of an object (for example, an aperture or a mask) that changes a shape of the beam. The "far field" beam profile is the distribution of electromagnetic energy far away from the object.

Referring to FIGS. 3-8, in one implementation, the attenuation optical system 152 is shown placed at various possible locations throughout the power ring amplifier 130. For example, in FIG. 3, the attenuation optical system 152 is placed inside the beam modification optical system 132 in the path of the light beam as it travels from the mirror 236 toward the beam magnification/de-magnification system 238. In FIG. 4, the attenuation optical system 152 is placed inside the beam modification optical system 132 in the path of the light beam as it travels from the beam magnification/de-magnification system 238 toward the optical coupler 234. In FIG. 5, the attenuation optical system 152 is placed inside the beam modification optical system 132 in the path of the light beam as it travels from the discharge chamber 140 toward the beam magnification/de-magnification system 238. In FIG. 6, the attenuation optical system 152 is placed in the path of the light beam as it travels from the discharge chamber 140 toward the prism 254. In FIG. 7, the attenuation optical system 152 is placed in the path of the light beam as it travels from the beam magnification/de-magnification system 238 toward the discharge chamber 140. In FIG. 8, the attenuation optical system 152 is placed in the path of the light beam as it travels through the beam magnification/de-magnification system 238 toward the discharge chamber 140.

Figure 9A:
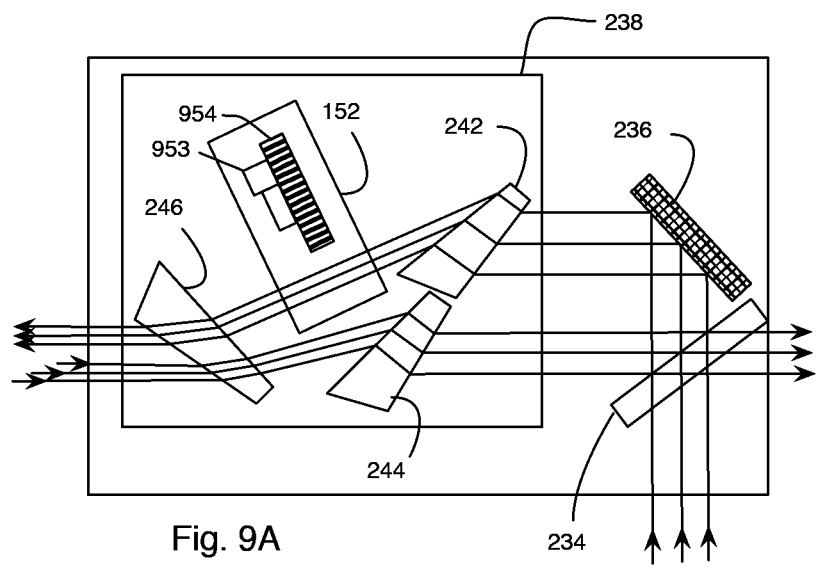
FIGS. 9A and 9B are block diagrams of an exemplary beam modification optical system including an attenuation optical system.
Figure 9B:
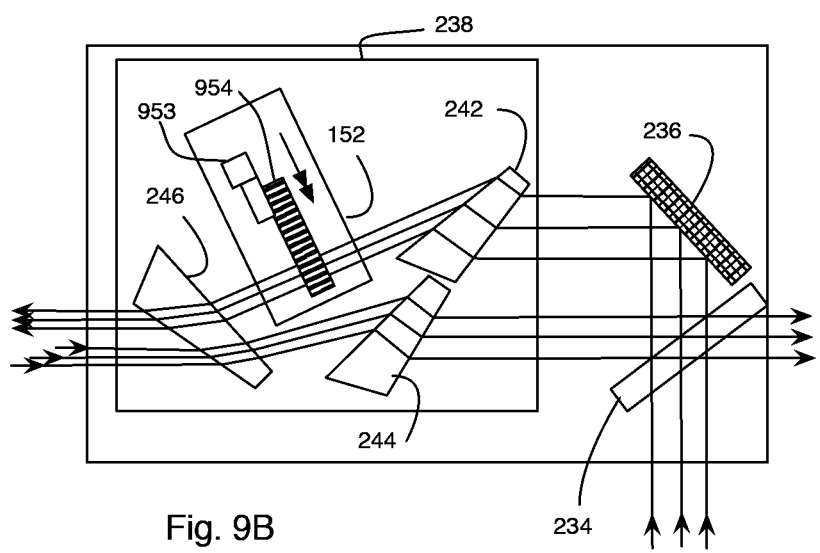

Referring to FIGS. 9A and 9B, in an exemplary implementation, the attenuation optical system 152 can be placed inside the beam magnification/de-magnification system 238. In this case, it is in the path of the light beam as it travels from the first prism 242 toward the third prism 246. As shown in FIG. 9A, the attenuation optical system 152 is set up with a first attenuation state in which the entire light beam is permitted to pass from the first prism 242 toward the third prism 246 without suffering any loss or attenuation. As discussed below, the attenuation factor applied to the light beam is one (1). As shown in FIG. 9B, the attenuation optical system 152 is set up with a second attenuation state, in which the light beam suffers a loss as it travels from the first prism 242 toward the third prism 246 by traveling through a portion of the system 152 that absorbs at least some of the flux, diffusely reflects at least some of flux, or both, of the light beam.

The attenuation optical system 152 includes an actuator 953 configured to receive an electromagnetic signal from the control system 170, and a plate 954 mounted to the actuator to be moveable between a plurality of positions. In this case, it is moveable between two positions. Each position places an attenuation region in the beam path such that the beam profile is covered by the attenuation region and each attenuation region represents an attenuation factor applied to the light beam as determined by a geometry of the attenuation region. At least one attenuation region includes a plurality of evenly-spaced elongated openings between solid energy-absorbing surfaces and at least one attenuation region includes an opening that is larger than the beam profile of the light beam.

In general, the attenuation factor is determined by the material of the system 152, and the geometry and placement of the system 152 relative to the light beam.

An exemplary design for an attenuation optical system 1052 is shown in FIGS. 10A-10D. In this design, the system 1052 includes a solid plate 1054 having a plurality of through openings 1056 through which some of the light beam can pass when the plate 1054 is inserted directly into the path 1058 of the light beam.

In the system 1052, the through openings 1056 have an elongated rectangular geometry. However, other geometries are possible, as discussed below. The geometry of the openings 1056 can be selected or configured to provide for specific attenuation factors. For example, the attenuation factor applied to the light beam can be determined to be the ratio of a total open area to a total area at which the light beam impinges. The total open area is the total area of the openings 1056 taken along the plane transverse to the light beam optical axis (which is along the direction of the path 1058) that is covered by the beam profile 1062 and the total area is the total area of both the open area and the solid surface that is covered by the beam profile 1062. Thus, the attenuation factor can be adjusted by adjusting the relative sizes of the open area to the solid area, which is directly dependent on the geometry of the plate 1054. For example, if the light beam passes through the attenuation optical system 1052 without any loss, then the total open area is equal to the total area covered by the beam profile 1062 and therefore the attenuation factor is 1. As another example, if the total open area is half the total area covered by the beam profile 1062, then the attenuation factor is 0.5. Thus, the attenuation factor ranges from 0 to 1, with 0 being 100% loss added to the light beam (in this case, the light beam is completely blocked) and 1 being 0% loss added to the light beam (in this case, the light beam passes entirely through without any loss).

There are two distinct attenuation states associated with the system 1052. In the first state, which is shown in FIGS. 10A and 10B, there is no attenuation and an attenuation factor of 1 is applied to the light beam. The plate 1054 is entirely out of the path 1058 of the light beam so that the entire light beam profile 1062 passes along the path 1058 unimpeded through the power ring amplifier 130. In the second state, which is shown in FIGS. 10C and 10D, there is an attenuation factor of about 0.5 applied to the light beam. The plate 1054, and specifically the portion with the openings 1056 is placed in the path of the light beam so that the beam profile 1062 of the light beam impinges upon the plate 1054.

Additionally, the geometry of the openings 1056 can be selected to improve certain characteristics of the beam profile. Thus, for example, elongated rectangular openings such as those shown in FIGS. 10A-10D may be suitable for maintaining specifications of the near field beam parameters of the light beam or to reduce the effect of beam modulation on the far field profile of the light beam. The actual geometry selected depends on the beam profile properties.

The openings 1056 can be arranged to extend beyond the beam profile 1062 to ensure that the entire beam profile 1062 is covered. Additionally, the arrangement and shape of the openings 1056 can be selected to provide a uniform geometric distribution across the beam profile 1062 without additional modulation to the plane of the beam. However, it may be possible to arrange the openings 1056 in a non-uniform or even random manner, depending on the application and the characteristics of the beam profile 1062.

The material of the plate 1054 is selected based on several factors. One factor to consider when selecting the material is the ability of the material to absorb the energy or flux of the light beam. At the same time, other factors that can be considered are the reduction of non-diffuse reflections from the surface and a low emissivity. These factors can be important for thermal stability of the plate 1054. For example, tungsten is a material that is suitable for providing good heat transfer, low emissivity, high absorption, and lower amounts of non-diffuse reflections.

If thermal stability is a problem with the attenuation optical system 1052 and 152, then it is possible to provide a dedicated heat flow path from the plate to a heat sink.

Another exemplary design for an attenuation optical system 1152 is shown in FIGS. 11A-11F. In this design, the system 1152 includes a circular and rotatable plate 1154 that defines four distinct attenuation states S1, S2, S3, S4. Each state is defined by a region of the plate 1154, which can be selectively moved by rotation of the plate 1154 about the center axis 1164 (which is parallel with the beam path 1158) to intersect the path 1158, with the region selected depending on the desired attenuation factor to be applied to the light beam.

The first attenuation state S1 is shown in FIGS. 11A and 11B; in this state, there is no attenuation because an attenuation factor of 1 is applied to the light beam. The region of the plate 1154 that is in the path 1158 of the beam profile 1162 is entirely open and thus, the entire light beam profile 1162 passes along the path 1158 unimpeded through the power ring amplifier 130 in the first attenuation state.

The remaining attenuation states S2, S3, S4 are defined by solid regions of the plate with a plurality of through openings, with each of the states S2, S3, S4 having a distinct ratio of the total open area to the total area at which the light beam impinges. For example, in FIGS. 11C and 11D, the third attenuation state S3 is selected, and the attenuation factor of 0.5 associated with the state S3 is applied to the light beam. The plate 1154, and specifically the region with the openings 1156 that define the third state S3 is placed in the path of the light beam so that the beam profile 1162 of the light beam impinges upon the plate 1154 in that region.

As another example, in FIGS. 11E and 11F, the fourth attenuation state S4 is selected, and the attenuation factor of 0.7 associated with the state S4 (which is distinct from the attenuation factor of the other attenuation states) is applied to the light beam.

In the implementations described, the attenuation optical system 152 is a solid plate with machined through holes or openings. However, other designs are possible. For example, in other implementations, the attenuation optical system 152 can include a mesh structure that consists of a semi-permeable barrier made of connected strands of elongated material such as metal. The mesh structure can be similar to a net structure and have woven strands.

In other implementations, the attenuation optical system 152 can be designed to diffusely refract portions of the light beam to thereby increase the loss in the power ring amplifier. In other implementations (such as those shown in FIGS. 13A-15C, described below), the attenuation optical system 152 can be designed to reflect away a percentage of the light beam and direct the reflected light to a beam dump.

Other components of the power ring amplifier 130 provide innate attenuation to the light beam; however, the attenuation optical system 152 provides for adjustable attenuation to enable the adjustment of the pulse energy without having to adjust the operating voltage or the gas pressure.

Figure 12:
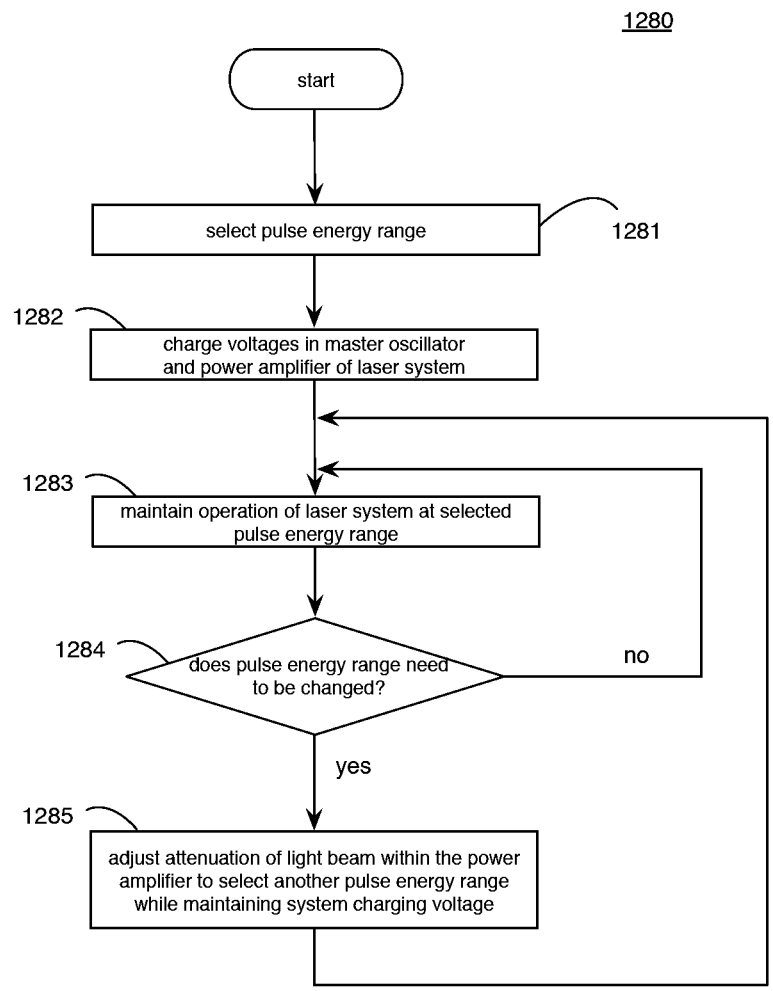
FIG. 12 is a flow chart of a procedure performed by the deep ultraviolet light source to adjust the output power of the light beam input to a lithography exposure apparatus of FIG. 1.

Referring to FIG. 12, a flow chart of a procedure 1280 is performed by the system 100 to switch between pulse energy ranges of the light beam output from the light source 110. The pulse energy range for the output light beam is selected from among a plurality of pulse energy ranges (step 1281). Based on the selected pulse energy range for the output light beam, the control system 170 applies a voltage to the electrodes of the gas discharge chamber 114 of the master oscillator 112 and applies a voltage to the electrodes of the gas discharge chamber 140 of the regenerative ring resonator of the power ring amplifier 130 (step 1282). The applied voltage is selected from an available voltage control range for the master oscillator 112. The light source 110 is operated at the selected pulse energy range (step 1283). Next, if no instructions have been received to change the pulse energy range (step 1284), then the light source 110 is maintained at the selected pulse energy range (step 1283). However, if instructions are received to change the pulse energy range (step 1284) to another pulse energy range, then the control system 170 sends a signal to the attenuation optical system 152 to adjust, within the regenerative ring resonator, an attenuation of the light beam while maintaining a ratio of a change of applied voltage to the master oscillator electrodes to the available voltage control range below a predetermined value (step 1285).

Additionally, the pulse energy range can be changed at step 1285 while maintaining a gas recipe of the gas discharge chamber 140 of the power ring amplifier 130.

Attenuation of the light beam can be adjusted from an attenuation factor of 1 (with no attenuation) to an attenuation factor of 0.8 by absorbing about 20% of the flux of the light beam.

Figure 13A:
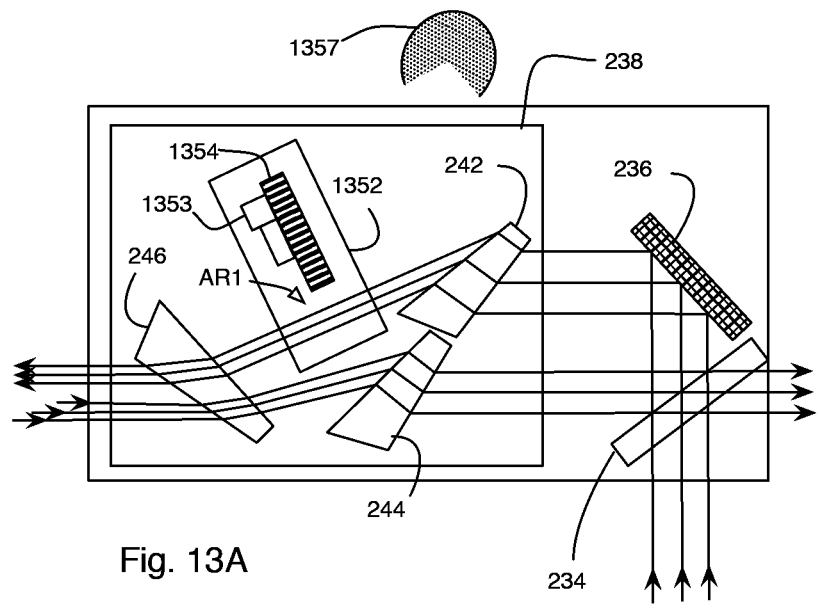
FIGS. 13A and 13B are block diagrams of an exemplary beam modification optical system including a reflective attenuation optical system.
Figure 13B:
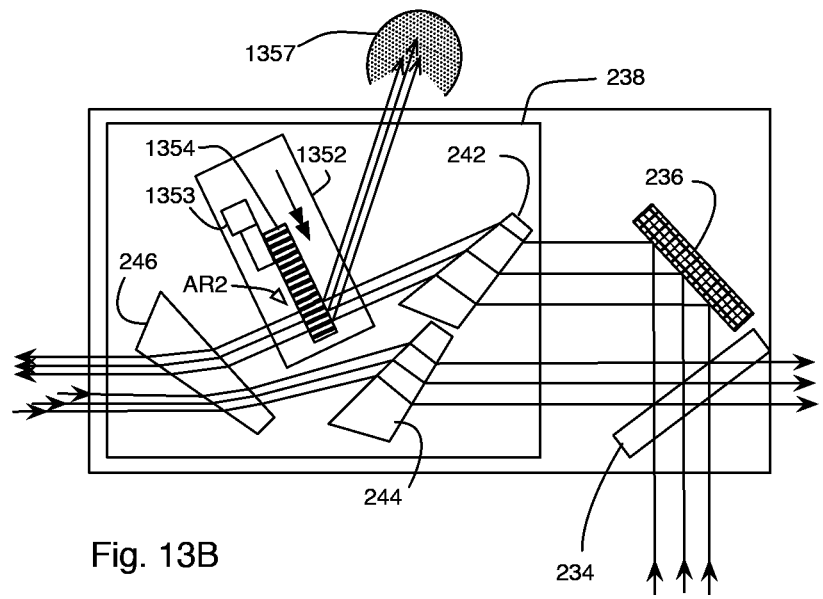

Referring to FIGS. 13A and 13B, as mentioned above, the attenuation optical system 1352 can be designed to reflect a percentage of the light beam away from the path and direct the reflected light to a beam dump 1357. The attenuation optical system 1352 is placed inside the beam magnification/demagnification system 238. In this case, it is in the path of the light beam as it travels from the first prism 242 toward the third prism 246.

The attenuation optical system 1352 includes at least one attenuation region AR1 (FIG. 13A) that has an open area that is larger than the beam profile of the light beam to permit the light beam to entirely pass through and suffer no attenuation and at least one attenuation region AR2 (FIG. 13B) having a plurality of evenly-spaced elongated openings between solid energy-reflecting surfaces (as discussed in more detail below) to thereby reduce the flux of the light beam by reflecting some of the light beam toward the beam dump 1357.

In the first attenuation state (shown in FIG. 13A), the entire light beam is permitted to pass from the first prism 242 toward the third prism 246 through the attenuation region AR1 without suffering any loss or attenuation. The attenuation factor applied to the light beam is one (1) in the first attenuation state. In the first attenuation state, the plate 1354 can be considered to be in a refracted state. In the second attenuation state (shown in FIG. 13B) the light beam suffers a loss as it travels from the first prism 242 toward the third prism 246 by traveling through the region AR2 of the system 1352 that reflects at least some of the flux of the light beam toward the beam dump 1357. In the second attenuation state, the plate 1354 can be considered to be in an inserted state (since the region AR2 in the beam path).

Similar to the attenuation optical system 152 described above, the attenuation optical system 1352 includes an actuator 1353 configured to receive an electromagnetic signal from the control system 170, and a plate 1354 mounted to the actuator to be moveable between a plurality of positions. In this case, it is moveable between two positions and each position places an attenuation region (AR1 or AR2) in the beam path such that the beam profile is covered by the attenuation region and each attenuation region represents an attenuation factor applied to the light beam as determined by a geometry of the attenuation region. At least one attenuation region includes a plurality of evenly-spaced elongated openings between solid energy-reflecting surfaces and at least one attenuation region includes an open area that is larger than the beam profile of the light beam.

In general, the attenuation factor is determined by the material of the system 1352 and the plate 1354, the geometry of the plate 1354 and the openings, and the placement of the plate 1354 relative to the light beam.

Referring to FIGS. 14A-14C, an exemplary reflective attenuation optical system 1452 (designed based on the principles described in FIGS. 13A and 13B) is shown while in the second attenuation state in which the entire beam profile 1462 of the light beam 1424 travels toward the region AR2 of the plate 1454, which has an energy-reflecting surface 1459 that reflects at least some of the flux of the light beam (the reflected light beam 1461) toward the beam dump 1357. The plate 1454 also includes a plurality of elongated openings 1456 formed through the solid energy-reflecting surface 1459. Thus, some of the flux of the light beam 1424 passes through the openings 1456 and within the power amplifier 130.

As evident from FIGS. 14A and 14B, the openings 1456 have a geometry or angle that aligns with the path of the beam 1424 in that the sidewalls of the openings 1456 are generally parallel with the optical axis OA of the beam 1424 even though the plate 1454 is placed at an angle $\phi$ relative to the optical axis OA. In the example shown in FIG. 14B, the angle is measured between the normal to the surface of the plate 1454 and the optical axis OA, but other conventions for determining the angle $\phi$ can be used.

By reflecting the flux of the light beam 1424 away from the beam path and the power amplifier 130 instead of absorbing the flux, the plate 1354, 1454 and thus the attenuation optical system 1352, 1452 can be kept cooler because the flux is not absorbed. Moreover, by using a mesh design, in which openings 1456 are interspersed throughout an energy-reflecting surface 1459, the light beam 1424 is not displaced by changing from one attenuation state to another. For example, if the attenuation optical system were designed with a partially-reflecting optic such as a beam splitter in which the light beam passes through material when reflecting from the optic and also passes through material while being transmitting through the optic, then the light beam would be displaced when changing from one attenuation to another because of the refraction of the beam as it is transmitted through such an optic. Such a displacement would be problematic for operation in the power amplifier 130, especially for a regenerative ring amplifier.

In some implementations, the plate 1354, 1454 is made of a metallic and conductive substrate to improve heat conduction away from the plate. For example, the substrate can be copper. The copper substrate can be polished to be smooth. And, a reflective coating can be applied to the polished copper substrate. Additionally, a protective overcoat can be applied over the reflective coating to reduce oxidation on the coating. The reflective coating can be made of any material that reflects light at the center wavelength of the light beam. For example, the reflective coating can be aluminum. The protective overcoat can be any material that either reflects or transmits the light at the center wavelength of the light beam. Exemplary overcoats can be made of dielectric layers or magnesium fluoride. In the example given above, for light at 193 nm, an aluminum coating can provide 90% reflectance and the use of the overcoat of magnesium fluoride can increase the reflectance to above 95%. The backside of the plate 1354, 1454 can be coated if desired to reflect any other beams on this side such as Fresnel beams from other optics within the power amplifier 130.

Referring to FIGS. 15A-15C, an exemplary plate 1554 is shown in plan view as seen from the optical axis of the light beam (FIG. 15A), in top cross-sectional view B-B in FIG. 15B, and in side cross-sectional view C-C in FIG. 15C. In this exemplary plate 1554, the openings 1556 are elongated along one direction and the angle $\phi$ at which the plate 1554 is placed within the path of the light beam is about 9°.

Other implementations are within the scope of the following claims.

For example, while distinct attenuation factors were discussed and described above, it is possible to adjust the attenuation of the light beam continuously so that the attenuation factor is a continuously variable value applied to the light beam. Such a continuous adjustment can be performed by tuning an angle of the plate about an axis that is perpendicular to the optic axis (or the beam path) of the light beam. In other implementations, the openings in the plate can be polygonal shapes or circular or oval shapes. Other metals or alloys can be used for the plate or mesh, as long as the material is able to absorb the energy of the light beam without overheating or changing state.

What is claimed is:

1. A deep ultraviolet light source comprising:
   a regenerative ring resonator comprising:
      a discharge chamber having electrodes and a gain medium between the electrodes;
      an optical coupler that is partially reflective so that at least a portion of a light beam impinging on the optical coupler from the discharge chamber is reflected back through the discharge chamber and at least a portion of the light beam impinging on the optical coupler from the discharge chamber is transmitted through the optical coupler; and
      an attenuation optical system having a surface that is at least partly reflective to the light beam and being placed in the path of the light beam within the resonator, the attenuation optical system having a plurality of distinct attenuation states, with each attenuation state defining a distinct attenuation factor applied to the light beam; and
   a control system connected to the attenuation optical system and configured to select an attenuation state applied to the light beam to thereby adjust an energy of the light beam output from the light source.

2. The light source of claim 1, wherein the regenerative ring resonator is defined by the optical coupler and a beam reverser on a side of the discharge chamber opposite to the side at which the optical coupler is facing.

3. The light source of claim 1, wherein the regenerative ring resonator comprises a beam magnification and de-magnification stage that de-magnifies the light beam as the light beam travels along a first direction from the optical coupler toward the discharge chamber and that magnifies the light beam as the light beam travels along a second direction away from the discharge chamber toward the optical coupler.

4. The light source of claim 3, wherein the attenuation optical system is inside of the magnification and de-magnification stage.

5. The light source of claim 3, wherein the magnification and de-magnification stage comprises a set of prisms.

6. The light source of claim 5, wherein the prism set comprises first, second, and third prisms configured and arranged so that the first and third prisms reduce the transverse size of the profile of the light beam travelling along the first direction through the magnification and de-magnification stage, and the third and second prisms increase the transverse size of the profile of the light beam travelling along the second direction through the magnification and de-magnification stage.

7. The light source of claim 1, wherein the attenuation optical system includes a plate that defines the partly reflective surface, and has at least one mesh portion through which the light beam travels, the mesh portion applying the attenuation factor to the light beam.

8. The light source of claim 7, wherein the mesh portion includes through openings defined within the partly reflective surface, the size and geometry of the openings and the reflectance of the partly reflective surface determine the attenuation factor of the light beam.

9. The light source of claim 1, wherein the attenuation factor applied to the light beam includes an amount of attenuation applied to the light beam.

10. The light source of claim 9, wherein the attenuation amount applied to the light beam is a loss in intensity of the flux of the light beam.

11. The light source of claim 1, wherein the attenuation optical system comprises a plate on which the reflective surface is applied, the plate having openings through which the light beam travels, and the reflective surface configured to reflect a portion of the light beam off the path of the light beam within the resonator.

12. The light source of claim 11, wherein the plate is made of copper, the reflective surface is formed at least in part from an aluminum coating on the copper plate.

13. The light source of claim 12, wherein the reflective surface also includes an overcoating of magnesium fluoride on top of the aluminum coating.

14. A method of switching between pulse energy ranges of a light beam output from a deep ultraviolet light source that comprises a master oscillator providing a seed light beam to a regenerative ring resonator of a power amplifier, the method comprising:
 selecting a pulse energy range for the output light beam from among a plurality of pulse energy ranges;
 based on the selected pulse energy range for the output light beam, applying a voltage to electrodes of a gas discharge chamber of the master oscillator, the applied voltage being selected from an available voltage control range for the master oscillator, and applying a voltage to electrodes of a gas discharge chamber of the regenerative ring resonator;
 operating the light source at the selected pulse energy range; and
 if it is determined that the pulse energy range of the output light beam is to be changed, selecting another pulse energy range for the output light beam by adjusting, within the regenerative ring resonator, an attenuation of the light beam while maintaining a ratio of a change of applied voltage to the master oscillator electrodes to the available voltage control range below a predetermined value;
 wherein adjusting the attenuation of the light beam within the regenerative ring resonator comprises reflecting at least some of the flux of the light beam.

15. The method of claim 14, wherein adjusting the attenuation of the light beam comprises reflecting at least 50% of the flux of the light beam at the center wavelength of the light beam.

16. The method of claim 14, wherein maintaining the ratio of the change of applied voltage to the master oscillator electrodes to the available voltage control range below the predetermined value comprises maintaining the ratio below 0.10.

17. A regenerative ring resonator in the path of a light beam, the resonator comprising:
 a discharge chamber having electrodes and a gain medium between the electrodes;
 an optical coupler that is partially reflective so that at least a portion of a light beam impinging on the optical coupler from the discharge chamber is reflected back through the discharge chamber and at least a portion of the light beam impinging on the optical coupler from the discharge chamber is transmitted through the optical coupler; and
 an attenuation optical system in the path of the light beam within the resonator, the attenuation optical system having a plurality of distinct attenuation states, with each attenuation state defining a distinct attenuation factor applied to the light beam to provide adjustment of an energy of the light beam, the attenuation optical system comprising a reflective surface having through openings.

18. An attenuation optical system for use in a beam path of a light beam traveling through a regenerative ring resonator, the system comprising:
 an actuator configured to receive an electromagnetic signal; and
 a plate mounted to the actuator to be moveable between a plurality of positions, with each position placing an attenuation region in the beam path such that the beam profile is covered by the attenuation region and each attenuation region representing an attenuation factor applied to the light beam as determined by a geometry of the attenuation region,
 wherein at least one attenuation region includes a plurality of evenly-spaced elongated openings between solid energy-reflecting surfaces and at least one attenuation region includes an open area that is larger than the beam profile of the light beam.

* * * * *